United States Patent
Okamura et al.

(10) Patent No.: US 9,059,071 B2
(45) Date of Patent: *Jun. 16, 2015

(54) SEMICONDUCTOR DEVICE AND METHOD OF MANUFACTURING THE SAME

(71) Applicant: ROHM CO., LTD., Kyoto (JP)

(72) Inventors: Yuji Okamura, Kyoto (JP); Masashi Matsushita, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/861,776

(22) Filed: Apr. 12, 2013

(65) Prior Publication Data

US 2013/0221376 A1    Aug. 29, 2013

Related U.S. Application Data

(60) Continuation of application No. 13/205,176, filed on Aug. 8, 2011, now abandoned, which is a continuation of application No. 12/801,630, filed on Jun. 17, 2010, now Pat. No. 7,999,346, which is a continuation of (Continued)

(30) Foreign Application Priority Data

Mar. 28, 2002  (JP) ................... 2002-092530
Nov. 19, 2002  (JP) ................... 2002-335414

(51) Int. Cl.
  *H01L 29/47*  (2006.01)
  *H01L 29/16*  (2006.01)
  (Continued)

(52) U.S. Cl.
  CPC ............ *H01L 29/1608* (2013.01); *H01L 29/45* (2013.01); *H01L 29/47* (2013.01); *H01L 29/6606* (2013.01); *H01L 29/872* (2013.01); *H01L 29/66143* (2013.01)

(58) Field of Classification Search
  CPC ... H01L 29/872; H01L 29/1608; H01L 29/47; H01L 29/66143; H01L 29/45; H01L 29/66212; H01L 29/7783; H01L 29/7806; H01L 21/02491; H01L 21/02502; H01L 21/02529; H01L 21/0485; H01L 21/02378; H01L 21/28537; H01L 21/28581; H01L 21/8213; H01L 2224/0518; H01L 2924/0104; H01L 2924/01042; H01L 2924/01073; H01L 2924/01074; H01L 2924/12032; H01L 29/812
  USPC ............... 257/73, 77, 78, 472, 473, 743–745, 257/750, 761, 763, 765, 770
  See application file for complete search history.

(56) References Cited

U.S. PATENT DOCUMENTS 4,032,364 A * 6/1977 Anthony et al. ............. 438/133
4,062,103 A    12/1977 Yamagishi
(Continued)

FOREIGN PATENT DOCUMENTS

DE    199 39 107    3/2000
EP    0 789 388     8/1997
(Continued)

OTHER PUBLICATIONS

Porter, L. M. et al "A critical review of ohmic and rectifying contacts for silicon carbide" in: Materials Science and Engineering B, Elsevier Sequoia, Lausanne, CH, vol. 34, No. 2 (Nov. 1995), pp. 83-105, XP004000935, ISSN: 0921-5107.
(Continued)

*Primary Examiner* — Bac Au
(74) *Attorney, Agent, or Firm* — Rabin & Berdo, P.C.

(57) ABSTRACT

A semiconductor device provided with a silicon carbide semiconductor substrate, and an ohmic metal layer joined to one surface of the silicon carbide semiconductor substrate in an ohmic contact and composed of a metal material whose silicide formation free energy and carbide formation free energy respectively take negative values. The ohmic metal layer is composed of, for example, a metal material such as molybdenum, titanium, chromium, manganese, zirconium, tantalum, or tungsten.

14 Claims, 10 Drawing Sheets

Related U.S. Application Data application No. 11/452,226, filed on Jun. 14, 2006, now Pat. No. 7,745,317, which is a division of application No. 10/397,177, filed on Mar. 27, 2003, now Pat. No. 7,262,434.

(51) Int. Cl.
*H01L 29/45* (2006.01)
*H01L 29/66* (2006.01)
*H01L 29/872* (2006.01)

(56) References Cited

U.S. PATENT DOCUMENTS

| | | | |
|---|---|---|---|
| 4,213,840 A | 7/1980 | Omori et al. | |
| 4,224,115 A | 9/1980 | Nara et al. | |
| 4,398,344 A | 8/1983 | Gould | |
| 4,669,180 A | 6/1987 | Thomas et al. | |
| 4,674,177 A | 6/1987 | Calviello | |
| 4,691,435 A | 9/1987 | Anantha et al. | |
| 4,859,616 A | 8/1989 | Losehand et al. | |
| 4,990,994 A | 2/1991 | Furukawa et al. | |
| 5,055,424 A * | 10/1991 | Zeidler et al. | 438/105 |
| 5,200,349 A | 4/1993 | Yokoyama | |
| 5,442,200 A | 8/1995 | Tischler | |
| 5,635,412 A | 6/1997 | Baliga et al. | |
| 5,789,311 A | 8/1998 | Ueno et al. | |
| 5,913,986 A * | 6/1999 | Matsuyama | 136/255 |
| 6,150,246 A | 11/2000 | Parsons | |
| 6,281,124 B1 * | 8/2001 | Vaartstra | 438/681 |
| 6,362,495 B1 * | 3/2002 | Schoen et al. | 257/77 |
| 6,365,494 B2 | 4/2002 | Rupp et al. | |
| 6,410,460 B1 | 6/2002 | Shalish et al. | |
| 6,468,890 B2 | 10/2002 | Bartsch et al. | |
| 6,562,706 B1 | 5/2003 | Liu et al. | |
| 6,573,128 B1 | 6/2003 | Singh | |
| 6,770,912 B2 | 8/2004 | Ota | |
| 6,884,644 B1 | 4/2005 | Slater, Jr. et al. | |
| 7,208,392 B1 | 4/2007 | Jaussaud et al. | |
| 7,999,346 B2 | 8/2011 | Okamura et al. | |
| 2001/0039105 A1 | 11/2001 | Rupp et al. | |
| 2002/0068488 A1 | 6/2002 | Tuller et al. | |

FOREIGN PATENT DOCUMENTS

| | | |
|---|---|---|
| GB | 918393 | 2/1963 |
| JP | 2000-164528 A | 6/2000 |
| JP | 2000-208438 | 7/2000 |
| JP | 2001-53293 | 2/2001 |
| JP | 2004-22796 | 1/2004 |
| WO | WO-00/16382 | 3/2000 |

OTHER PUBLICATIONS

Held, R. et al "SiC Merged p-n/Schottky Rectifiers for High Voltage Applications" in: Materials Science Forum, Aedermannsfdorf, CH, vol. 264-268, No. Part 2 (1998), pp. 1057-1060, XP000944900, ISSN:0255-5476.

Hare, S. et al "Control of Schottky and ohmic interfaces by unpinning Fermi level" in: Applied Surface Science, Elsevier, Amsterdam, NL, vol. 117/118 (1997), pp. 394-399, XP000749905, ISSN: 0169-4332.

Edmond, J. A. et al "Electrical Contacts to Beta Silicon Carbide Thin Films" in: Journal of The Electrochemical Society, Electrochemical Society. Manchester, New Hampshire, US, vol. 135, No. 2 (Feb. 1988), pp. 359-362, XP000979375, ISSN:0013-4651.

"Silicon Carbide Ceramics (SiC)" Shigeyuki Somiya et al, Rohm Co., Ltd., Device Technology Div., Semiconductor R&D Headquarters, Uchida Rokakuho, Sep. 15, 1988, pp. 177-182.

\* cited by examiner

SEMICONDUCTOR DEVICE AND METHOD OF MANUFACTURING THE SAME

CROSS-REFERENCE TO RELATED APPLICATIONS

This application is a continuation of application Ser. No. 13/205,176, filed on Aug. 8, 2011, which is a continuation of application Ser. No. 12/801,630, filed on Jun. 17, 2010 (now U.S. Pat. No. 7,999,346, to be issued Aug. 16, 2011), which is a continuation of application Ser. No. 11/452,226, filed on Jun. 14, 2006 (now U.S. Pat. No. 7,745,317, issued Jun. 29, 2010), which in turn is a divisional of application Ser. No. 10/397,177, filed on Mar. 27, 2003 (now U.S. Pat. No. 7,262,434, issued Aug. 28, 2007). Application Ser. No. 11/052,257, filed on Feb. 8, 2005 (now U.S. Pat. No. 7,294,858, issued Nov. 13, 2007) is also a divisional of application Ser. No. 10/397,177, filed on Mar. 27, 2003. The disclosures of these prior U.S. applications are incorporated herein by reference.

BACKGROUND OF THE INVENTION

1. Field of the Invention

The present invention relates to a semiconductor device such as a Schottky barrier diode using a silicon carbide semiconductor substrate and a method of manufacturing the same.

2. Description of Related Art

The configuration of a Schottky barrier diode using a silicon carbide (SiC) semiconductor substrate is as shown in FIG. 9(e). One surface of a SiC semiconductor substrate 100 is a silicon surface 110, and the other surface thereof is a carbon surface 120. A SiC epitaxial layer 101 is formed on the side of the silicon surface 110.

A titanium (Ti) metal layer 30, for example, is formed on the silicon surface 110, and a Schottky junction is formed in an interface between the silicon surface 110 and the Ti metal layer 30. Further, an Al surface electrode 50, for example, is formed on a surface of the Ti metal layer 30 in order to ensure good adhesion to a metal wire composed of aluminum (Al) or the like, for example, for making connection to an external electrode.

On the other hand, a nickel (Ni) metal layer 20, for example, is formed on the carbon surface 120, and an ohmic junction is formed in an interface between the carbon surface 120 and the Ni metal layer 20. Further, in order to satisfactorily connect the Schottky barrier diode to an external substrate having copper (Cu) wiring, for example, a silver (Ag) reverse surface electrode 40, for example, is formed on a surface of the Ni metal layer 20.

In manufacturing the Schottky barrier diode, the Ni metal layer 20 is formed on the carbon surface 120 of the SiC semiconductor substrate 100 having the epitaxial layer 101 on the side of the silicon surface 110 (step T1 in FIG. 10). In order to form a good ohmic junction in the interface between the carbon surface 120 and the Ni metal layer 20, the Ni metal layer 20 is heat-treated at 1000° C. for twenty minutes (step T2).

As shown in FIG. 9(b), the Ti metal layer 30 is formed on the silicon surface 110 of the SiC semiconductor substrate 100 (step T3 in FIG. 10). Thereafter, a resist 60 is applied to the surface of the Ti metal layer 30 to pattern the Ti metal layer 30 (step T4), as shown in FIG. 9(c), after which the Ti metal layer 30 is subjected to etching processing (step T5 in FIG. 10).

After the resist 60 is removed, the Ti metal layer 30 is heat-treated at 400° C. for twenty minutes, as shown in FIG. 9(d), in order to form a good Schottky junction to the SiC semiconductor substrate 100 (step T6 in FIG. 10). Thereafter, the Al surface electrode 50 and the Ag reverse surface electrode 40 are respectively formed on the surfaces of the Ti metal layer 30 and the Ni metal layer 20 (step T7), thereby forming the Schottky bather diode shown in FIG. 9(e).

As described in the foregoing, the Ni metal layer 20 and the Ti metal layer 30 are individually formed during manufacturing processes (steps T1 and T3), and are individually heat-treated (steps T2 and T6). Therefore, the heat treatment must be carried out at least twice, thereby making it difficult to shorten the manufacturing processes.

Furthermore, the Ni metal layer 20 is used as an ohmic electrode. Unless the heat treatment is carried out at a high temperature of approximately 1000° C., as shown in the step T2 in FIG. 10, therefore, a good ohmic junction cannot be formed in the interface between the Ni metal layer 20 and the carbon surface 120 of the SiC semiconductor substrate 100. Therefore, the operating characteristics of the Schottky barrier diode may be adversely affected by the heat treatment during the manufacturing processes, resulting in poor manufacturing yields.

SUMMARY OF THE INVENTION

An object of the present invention is to provide a semiconductor device capable of shortening manufacturing processes and a method of manufacturing the same.

Another object of the present invention is to provide a semiconductor device whose operating characteristics may not be adversely affected by a heat treatment during manufacturing processes and a method of manufacturing the same.

A semiconductor device according to the present invention comprises a silicon carbide semiconductor substrate; and an ohmic metal layer joined to one surface (which may be either a carbon surface or a silicon surface, for example, the carbon surface) of the silicon carbide semiconductor substrate in an ohmic contact and composed of a metal material whose silicide formation free energy and carbide formation free energy respectively take negative values.

According to this configuration, the ohmic metal layer brought into ohmic contact with the silicon carbide semiconductor substrate is formed using the metal material whose silicide formation free energy and carbide formation free energy respectively take negative values. The above-mentioned metal material forms a good ohmic junction in an interface to the silicon carbide semiconductor substrate by a heat treatment at a relatively low temperature (which is preferably a temperature of not less than the temperature of the silicon carbide semiconductor substrate in a case where the semiconductor device is operated, for example, 300° C. to 500° C.). Consequently, the adverse effect on the operating characteristics by the heat treatment can be eliminated.

It is preferable that the ohmic metal layer is composed of a metal material whose silicide formation free energy and carbide formation free energy at a temperature at the time of a heat treatment for joining the ohmic metal layer to a surface of the silicon carbide semiconductor substrate in an ohmic contact respectively take negative values.

According to this configuration, the metal material which is a material composing the ohmic metal layer can form a good ohmic junction because the silicide formation free energy and the carbide formation free energy of the metal material at the temperature at the time of the heat treatment respectively take negative values.

Examples of the above-mentioned metal material include at least one metal material selected from a group consisting of molybdenum, titanium, chromium, manganese, zirconium, tantalum, and tungsten (which may be a simple substance or an alloy of two or more metal materials in the group).

It is preferable that the carrier concentration of a semiconductor layer on the side of the one surface of the silicon carbide semiconductor substrate is within a range of $10^{17}$ to $10^{21}/cm^3$ (preferably $10^{19}$ to $10^{21}/cm^3$).

According to this configuration, the carrier concentration of the semiconductor layer brought into contact with the ohmic metal layer is sufficiently high, so that the ohmic metal layer is joined to the surface of the silicon carbide semiconductor substrate with a low resistance. Consequently, a good ohmic junction is formed.

There may be further provided a multi-layer metal structure having the ohmic metal layer, and a metal layer composed of a metal material different from that composing the ohmic metal layer and formed on a surface of the ohmic metal layer.

If a metal material having good adhesion to a metal wire (a bonding wire) composed of aluminum, gold, or the like is used as the above-mentioned other metal layer, external connection of the device can be satisfactorily carried out.

When the semiconductor device is mounted on a package provided with an electrode for external connection (an external electrode), for example, the external electrode and the ohmic metal layer can be satisfactorily connected to each other using a metal wire or a lead frame. When the metal wire connected between the external electrode and the ohmic metal layer is an aluminum wire, it is preferable that a metal layer composed of aluminum (Al), an aluminum-silicon alloy (Al/Si), or an aluminum-silicon-copper alloy (Al—Si—Cu) is formed in the ohmic metal layer. When the external electrode and the ohmic metal layer are directly connected to each other, that is, the ohmic metal layer is die-bonded to the lead frame, for example, it is preferable that a metal layer composed of silver (Au) or gold (Ag) is formed on a surface of the ohmic metal layer. Consequently, the ohmic metal layer can be connected to an external substrate composed of copper (Cu) wiring formed thereon, for example, with good adhesion.

Two or more metal layers may be provided on the surface of the ohmic metal layer. When the ohmic metal layer is a titanium metal layer, for example, a multi-layer metal structure in which a molybdenum metal layer is stacked on the titanium metal layer, and an aluminum metal layer, an Al—Si alloy metal layer, or the like is stacked on the molybdenum metal layer may be used. That is, adhesion of aluminum or an Al—Si alloy to the titanium metal layer is not so good. However, a good adhesive state is obtained in an interface between the metal layers by interposing the molybdenum metal layer therebetween, thereby making it possible to manufacture a semiconductor device having high reliability.

The carrier concentration of a first semiconductor layer on the side of the one surface (for example, the carbon surface) of the silicon carbide semiconductor substrate may be higher than the carrier concentration of a second semiconductor layer on the side of the other surface (for example, the silicon surface) of the silicon carbide semiconductor substrate. In this case, there may be further provided a Schottky metal layer joined to the other surface in a Schottky contact and composed of the same material as that composing the ohmic metal layer.

According to this configuration, a Schottky bather diode composed of a SiC semiconductor is obtained. Metal layers having the same metal material are respectively formed on both the surfaces of the silicon carbide semiconductor substrate. Therefore, even if one of the metal layers is formed after the other metal layer is formed, neither of the metal layers is contaminated.

Furthermore, the metal material composing the ohmic metal layer and the Schottky metal layer is a metal material whose silicide formation free energy and carbide formation free energy respectively take negative values. Accordingly, an ohmic junction can be formed by a heat treatment at a relatively low temperature. When the heat treatment at a relatively low temperature is carried out after the ohmic metal layer and the Schottky metal layer are formed, therefore, the ohmic metal layer brought into contact with the first semiconductor layer having a relatively high carrier concentration is satisfactorily joined to the first semiconductor layer in an ohmic contact, and a good Schottky junction is formed between the Schottky metal layer brought into contact with the second semiconductor layer having a relatively low carrier concentration and the second semiconductor layer. A Schottky barrier diode having good characteristics can be manufactured by a single heat treatment at a relatively low temperature.

According to experiments conducted by the inventors of the present application, it has become clear that the Schottky barrier diode having the above-mentioned configuration has good breakdown voltage. Further, metal layers composed of the same metal material are respectively formed on both the surfaces of the SiC semiconductor substrate. Accordingly, heat treatments on both the surfaces of the semiconductor substrate can be carried out at one time, thereby making it possible to shorten the manufacturing processes.

It is preferable that the carrier concentration of the first semiconductor layer is within a range of $10^{17}$ to $10^{21}/cm^3$ (preferably $10^{19}$ to $10^{21}/cm^3$). Further, the carrier concentration of the second semiconductor layer is preferably within a range of $10^{14}$ to $10^{16}/cm^3$ (preferably $10^{15}$ to $10^{16}/cm^3$).

According to this configuration, the ohmic metal layer satisfactorily joined to the first semiconductor layer in an ohmic contact can be formed, and the Schottky metal layer satisfactorily joined to the second semiconductor layer in a Schottky contact can be formed.

One mode of a method of manufacturing a semiconductor device according to the present invention comprises a film forming step for forming a metal layer on one surface (which may be either a carbon surface or a silicon surface, for example, the carbon surface) of a silicon carbide semiconductor substrate; and a heat-treating step for subjecting the metal layer to a heat treatment in a temperature range of 300° C. to 500° C. after the film forming step, to form an ohmic junction between the metal layer and the one surface of the silicon carbide semiconductor substrate. The film forming step comprises the step of forming the metal layer brought into contact with the silicon carbide semiconductor substrate using a metal material whose silicide formation free energy and carbide formation free energy at the temperature of the silicon carbide semiconductor substrate in the heat-treating step respectively take negative values.

According to the present invention, the metal layer (ohmic metal layer) joined to the surface of the silicon carbide semiconductor substrate in an ohmic contact can be formed by the heat treatment in a temperature range of relatively low temperatures (which are preferably not less than the temperature of the silicon carbide semiconductor substrate in a case where the semiconductor device is operated, for example, 300° C. to 500° C.). Consequently, a silicon carbide semiconductor device having good characteristics can be manufactured.

It is preferable that the film forming step comprises the step of forming the metal layer brought into contact with the silicon carbide semiconductor substrate using at least one metal material selected from a group consisting of molybdenum, titanium, chromium, manganese, zirconium, tantalum, and tungsten.

The silicide formation free energy and the carbide formation free energy of the metal material respectively take negative values. Accordingly, a metal layer satisfactorily joined to the silicon carbide semiconductor substrate in an ohmic contact can be formed by the heat treatment at a low temperature.

Another mode of the present invention relates to a method of manufacturing a semiconductor device using a silicon carbide semiconductor substrate in which the carrier concentration of a first semiconductor layer on the side of its one surface is higher than the carrier concentration of a second semiconductor layer on the side of the other surface. This method comprises a first film forming step for forming a first metal layer brought into contact with the first semiconductor layer in the silicon carbide semiconductor substrate; a second film forming step for forming a second metal layer brought into contact with the second semiconductor layer in the silicon carbide semiconductor substrate and composed of the same metal material as that composing the first metal layer; a heat-treating step for simultaneously heat-treating the first metal layer and the second metal layer at a predetermined temperature after the first film forming step and the second film forming step, to form an ohmic junction between the first metal layer and the first semiconductor layer as well as to form a Schottky junction between the second metal layer and the second semiconductor layer. The first and second film forming steps comprise the steps of respectively forming the first and second metal layers brought into contact with the silicon carbide semiconductor substrate using a metal material whose silicide formation free energy and carbide formation free energy at the temperature of the silicon carbide semiconductor substrate in the heat-treating step respectively take negative values.

When the second metal layer must be patterned, the first metal layer may be formed after the second metal layer is formed.

According to this method, the Schottky bather diode using the silicon carbide semiconductor substrate can be manufactured. In this case, at a single heat treatment, the first metal layer can be joined to the silicon carbide semiconductor substrate in an ohmic contact in the first semiconductor layer having a relatively high carrier concentration, and the second metal layer can be joined thereto in a Schottky contact on the surface of the second semiconductor layer having a relatively low carrier concentration. Heat treatments for respectively forming the ohmic metal layer and the Schottky metal layer can be simultaneously carried out, thereby making it possible to shorten the manufacturing processes.

It is preferable that the heat-treating step is the step of carrying out the heat treatment within a temperature range of 300° C. to 500° C.

According to this method, the heat treatment is performed in a low temperature range of 300° C. to 500° C. Therefore, device characteristics are not degraded by the heat treatment.

When the heat treatment is carried out at a temperature of not more than 300° C., a good ohmic junction may not be formed. Further, a time period required for the heat treatment is lengthened. Accordingly, a time period required for the manufacturing processes is lengthened, thereby reducing the manufacturing efficiency. On the other hand, when the heat treatment is carried out at a temperature of not less than 500° C., an interface to be a Schottky junction may undesirably become an ohmic junction. If the heat treatment is carried out within a temperature range of 300° C. to 500° C., the time period required for the manufacturing processes may not be lengthened. Further, a good ohmic junction and a Schottky junction can be formed.

It is preferable that the first and second film forming steps comprise the steps of respectively forming the first and second metal layers brought into contact with the silicon carbide semiconductor substrate using at least one metal material selected from a group consisting of molybdenum, titanium, chromium, manganese, zirconium, tantalum, and tungsten.

The silicide formation free energy and the carbide formation free energy of the above-mentioned metal respectively take negative values. By the above-mentioned heat treatment at a low temperature, therefore, the first metal layer can be satisfactorily joined to the first semiconductor layer in an ohmic contact, and the second metal layer can be satisfactorily joined to the second semiconductor layer in a Schottky contact.

The upper limit of a temperature at which the Schottky junction in an interface between the silicon carbide semiconductor substrate and the above-mentioned metal layer formed in contact therewith is changed to an ohmic junction is approximately 500° C. Accordingly, it is preferable that the heat-treating step is carried out within a temperature range of 350° C. and 450° C. This eliminates the possibility that the operating characteristics of the semiconductor device are affected by the heat treatment temperature during the manufacturing processes, thereby making it possible to improve manufacturing yields.

It is preferable that the film forming step for forming on the first metal layer another metal layer composed of a metal material different from the metal material composing the first metal layer is carried out after the first film forming step, and the film forming step for forming on the second metal layer another metal layer composed of a metal material different from the metal material composing the second metal layer is carried out after the second film forming step, and the heat-treating step is carried out after the other metal layers are respectively formed on the first metal layer and the second metal layer.

Therefore, the multi-layer metal structure on the side of the first metal layer and the multi-layer metal structure on the side of the second metal layer can be together heat-treated. By the heat treatments, an ohmic junction is formed in the interface between the first metal layer and the silicon carbide semiconductor substrate, and a Schottky junction is formed in the interface between the second metal layer and the surface of the silicon carbide semiconductor substrate. In addition, adhesion in the interface between the first metal layer and the other metal layer on the surface thereof and the interface between the second metal layer and the other metal layer on the surface thereof can be also enhanced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
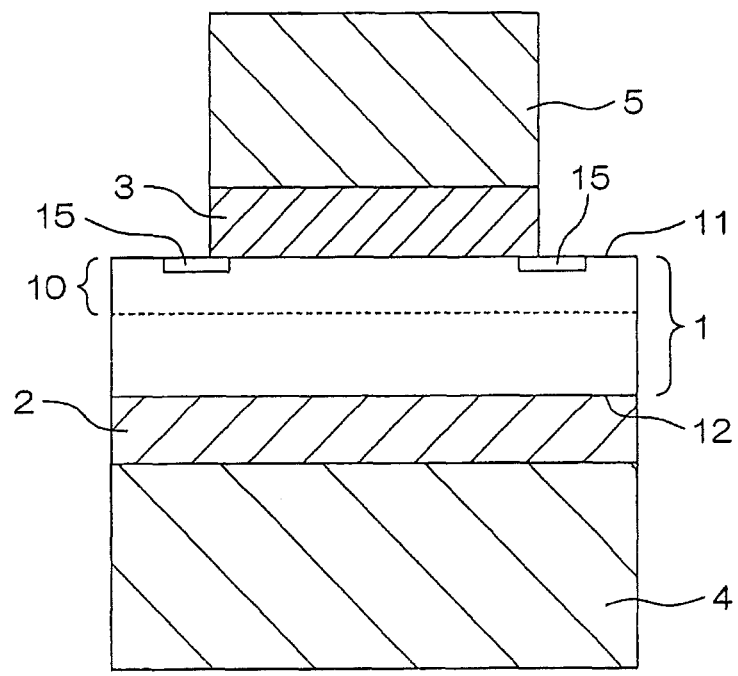
FIG. 1 is a cross-sectional view schematically showing the configuration of a semiconductor device according to an embodiment of the present invention.

FIG. 1 is a cross-sectional view schematically showing the configuration of a semiconductor device according to an embodiment of the present invention. The semiconductor device is a Schottky barrier diode, for example. An example of a semiconductor substrate is an N-type SiC semiconductor substrate (e.g., a 4H—SiC epiwafer) 1 having a surface orientation of {0001} and having an off angle of 8°. An edge termination 15 is formed, in the SiC semiconductor substrate 1, by boron implantation and annealing at a relatively low temperature (approximately 1000° C.). One surface of the SiC semiconductor substrate 1 is a silicon surface 11, and the other surface thereof is a carbon surface 12.

An N-type SiC semiconductor epitaxial layer 10 having a thickness of approximately 10 μm and having a carrier concentration of $4.0 \times 10^{15}/cm^3$ to $8.0 \times 10^{15}/cm^3$ is formed on the silicon surface 11. Consequently, the carrier concentration in the SiC semiconductor substrate 1 on the side of the silicon surface 11 is relatively lower than that on the side of the carbon surface 12, and the carrier concentration in the SiC semiconductor substrate 1 on the side of the carbon surface 12 is relatively higher than that on the side of the silicon surface 11. Specifically, the carrier concentration on the side of the silicon surface 11 is within a range of $10^{15}$ to $10^{16}/cm^3$, and the carrier concentration on the side of the carbon surface 12 is within a range of $10^{18}$ to $10^{19}/cm^3$.

A surface molybdenum metal layer 3 is formed on the silicon surface 11. The surface molybdenum metal layer 3 coats a predetermined region (a region surrounded by the edge termination 15) of the silicon surface 11, and a Schottky junction is formed in an interface between the surface molybdenum metal layer 3 and the silicon surface 11 in contact with the surface molybdenum metal layer 3.

A surface metal layer 5 formed of a metal other than a molybdenum metal is formed as a surface electrode on a surface of the molybdenum metal layer 3. The surface metal layer 5 is formed of a metal having good adhesion to the surface molybdenum metal layer 3.

When an aluminum (Al) wire extending from an external electrode and the surface molybdenum metal layer 3 are wire-bonded to each other, for example, it is preferable that the surface metal layer 5 is formed of aluminum (Al), an aluminum-silicon alloy (Al—Si), an aluminum-silicon-copper alloy (Al—Si—Cu), or the like (a metal having good adhesion to aluminum). Consequently, the surface molybdenum metal layer 3 and the Al wire are electrically connected to each other satisfactorily through the surface metal layer 5.

On the other hand, a reverse surface molybdenum metal layer 2 is formed on the carbon surface 12. The reverse surface molybdenum metal layer 2 coats the overall carbon surface 12, and an ohmic junction is formed in an interface between the reverse surface molybdenum metal layer 2 and the carbon surface 12 in contact with the reverse surface molybdenum metal layer 2.

A reverse surface metal layer 4 formed of a metal other than a molybdenum metal is formed as a reverse surface electrode on a surface of the reverse surface molybdenum metal layer 2. The reverse surface metal layer 4 is formed of a metal having good adhesion to the reverse surface molybdenum metal layer 2.

When copper (Cu) wiring formed on a wiring board and the reverse surface molybdenum metal layer 2 are connected to each other, for example, it is preferable that the reverse surface metal layer 4 is formed of gold (Au), silver (Ag), or the like (a metal having good adhesion to copper). Consequently, the reverse surface molybdenum metal layer 2 and the Cu wiring are electrically connected to each other satisfactorily through the reverse surface metal layer 4.

Figure 2:
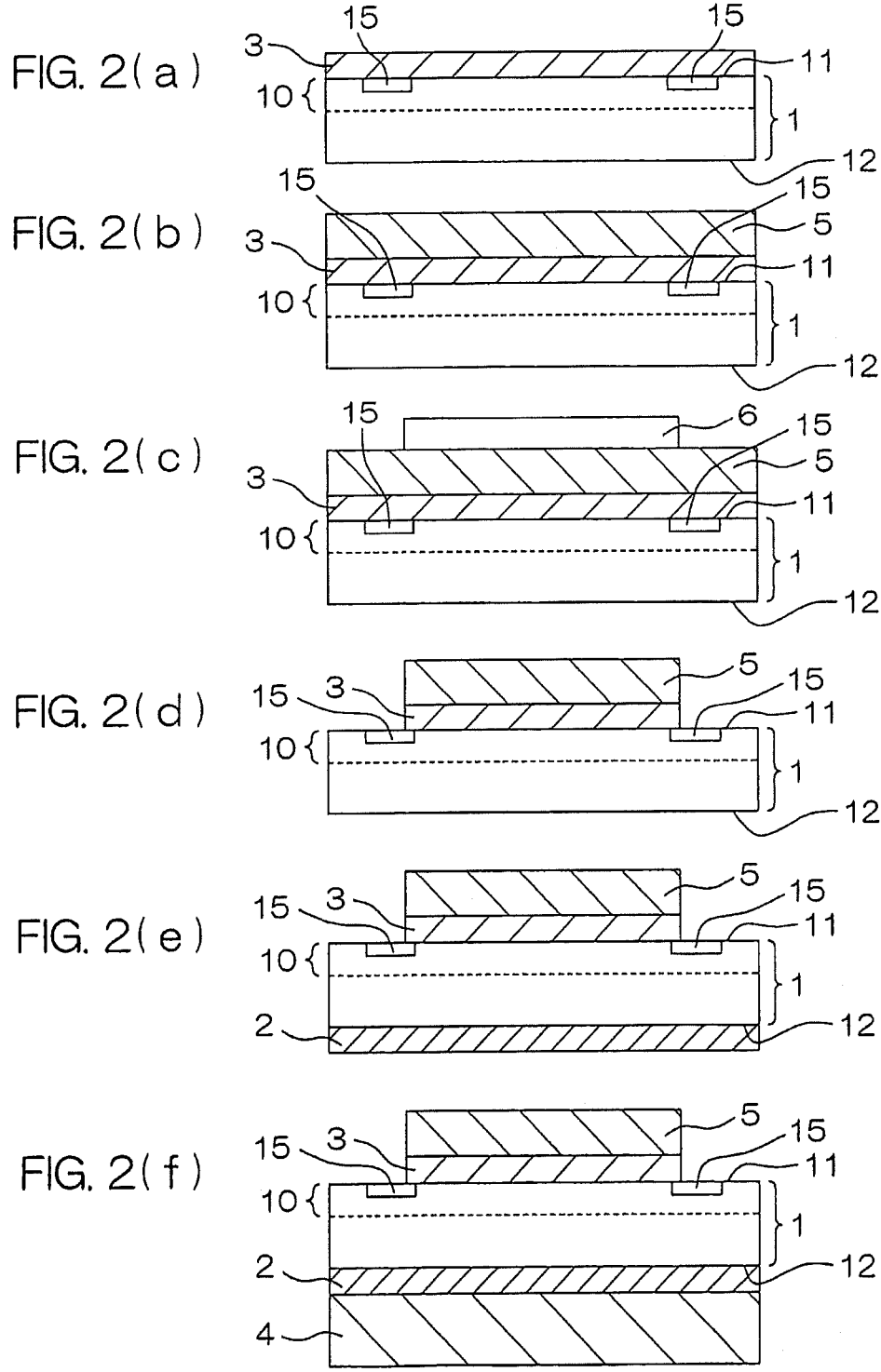
FIGS. 2(a) to 2(f) are diagrams schematically showing the steps of manufacturing a Schottky barrier diode according to an embodiment of the present invention.
Figure 3:
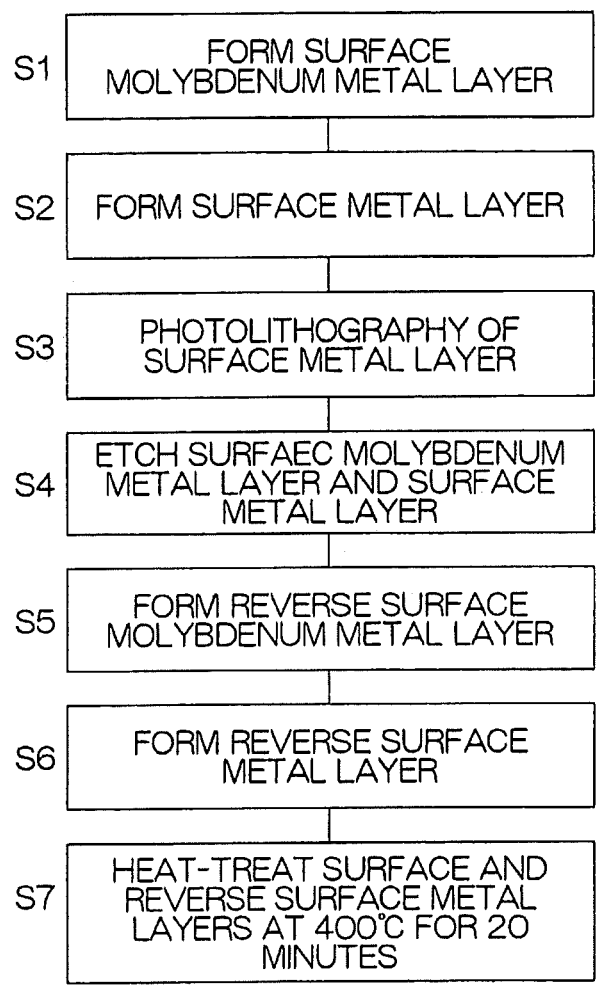
FIG. 3 is a flow chart showing the steps of manufacturing a Schottky bather diode according to an embodiment of the present invention.

FIGS. 2(a) to 2(f) are schematic cross-sectional views showing the steps of manufacturing the Schottky barrier diode having the above-mentioned configuration, and FIG. 3 is a flow chart showing the steps of manufacturing the Schottky bather diode.

As shown in FIG. 2(a), a silicon surface 11 of a SiC semiconductor substrate 1 having an epitaxial layer 10 formed on the silicon surface 11 (in which an edge termination 15 has already been formed) is subjected to acid cleaning such as RCA cleaning, and is then subjected to dilute hydrofluoric acid cleaning, to form a surface molybdenum metal layer 3 (step S1 in FIG. 3). The surface molybdenum metal layer 3 is formed using a sputtering method carried out by causing argon ions to collide with a molybdenum target. The degree of vacuum in a sputter chamber in which argon gas has not been introduced yet is $10^{-3}$ to $10^{-4}$ Pa, for example.

When the film formation processing of the surface molybdenum metal layer 3 is terminated, a metal layer composed of a metal other than molybdenum is formed on a surface of the surface molybdenum metal layer 3 using a sputtering method (step S2), as shown in FIG. 2(b), to form a surface metal layer 5. The surface metal layer 5 is formed by so-called continuous sputtering processing performed in a processing chamber where the surface molybdenum metal layer 3 is formed (step S1) by replacing the target with the inside of the chamber kept in a high vacuum state without being brought into an atmospheric state. At this time, I-V characteristics must be degraded (a forward rise voltage $V_F$ is increased, for example) if the inside of the chamber is brought into an atmospheric state once without performing continuous sputtering.

In order to pattern the surface molybdenum metal layer 3 and the surface metal layer 5, as shown in FIG. 2(c), photolithographic processing is then performed by application of a resist 6 and exposure processing (step 3 in FIG. 3). After the photolithographic processing is terminated, the surface molybdenum metal layer 3 and the surface metal layer 5 are patterned in a region surrounded by the edge termination 15 by being etched together using the resist 6 as a mask (step S4), as shown in FIG. 2(d). Thereafter, the resist 6 is removed.

Thereafter, after the dilute hydrofluoric acid cleaning, a reverse surface molybdenum metal layer 2 is formed on the carbon surface 12 of the SiC semiconductor substrate 1 by a sputtering method (step S5), as shown in FIG. 2(e). At this time, it is preferable that before a forward voltage at the time of the sputtering is applied, reverse sputtering for applying a reverse voltage is performed such that an interface between the reverse surface molybdenum metal layer 2 and the carbon surface 12 form a good ohmic junction. Consequently, the argon ions are irradiated onto the carbon surface 12 of the SiC semiconductor substrate 1, thereby removing an undesirable oxide film on the carbon surface 12.

When the film formation processing of the reverse surface molybdenum metal layer 2 is terminated, a metal layer composed of a metal other than molybdenum is formed on a surface of the reverse surface molybdenum metal layer 2 using a sputtering method (step S6), as shown in FIG. 2(f), to form a reverse surface metal layer 4. The reverse surface metal layer 4 is formed by so-called continuous sputtering processing performed in a processing chamber where the reverse surface molybdenum metal layer 2 is formed (step S5) by replacing the target with the inside of the chamber kept in a high vacuum state without being brought into an atmospheric state. At this time, I-V characteristics must be degraded (a forward rise voltage $V_F$ is increased, for example) if the inside of the chamber is brought into an atmospheric state once without performing continuous sputtering.

In such a way, the surface molybdenum metal layer 3 and the surface metal layer 5 are stacked on the silicon surface 11 of the SiC semiconductor substrate 1, and the reverse surface molybdenum metal layer 2 and the reverse surface metal layer 4 are stacked on the carbon surface 12 of the SiC semiconductor substrate 1, after which a heat treatment is performed at 400° C. for twenty minutes, for example (step S7). By a single heat treatment, a good Schottky junction is formed in the interface between the silicon surface 11 and the surface molybdenum metal layer 3 formed on the silicon surface 11, and adhesion in the interface between the surface molybdenum metal layer 3 and the surface metal layer 5 is strengthened. At the same time, a good ohmic junction is formed in the interface between the carbon surface 12 and the reverse surface molybdenum metal layer 2 formed on the carbon surface 12, and adhesion in the interface between the reverse surface molybdenum metal layer 2 and the reverse surface metal layer 4 is strengthened.

That is, a metal joined to the silicon surface 11 in a Schottky contact and a metal joined to the carbon surface 12 in an ohmic contact are both made of molybdenum, thereby making it possible to together heat-treat the two molybdenum metal layers 2 and 3 and the two metal layers 4 and 5. Consequently, the manufacturing processes for the Schottky barrier diode can be significantly shortened.

The heat treatment temperature is within a temperature range of 300° C. and 500° C. (e.g., 350° C. to 450° C.). Consequently, a temperature much lower than a heat treatment temperature of 1000° C. conventionally required when an Ni metal layer has been used is sufficient to carry out the heat treatment. Therefore, the operating characteristics of the Schottky barrier diode may not be adversely affected by the heat treatment temperature during the manufacturing processes, thereby making it possible to improve manufacturing yields.

If the heat treatment is carried out at a temperature of not more than 300° C., for example, a good ohmic junction cannot be formed in the interface between the carbon surface 12 and the reverse surface molybdenum metal layer 2 formed in contact with the carbon surface 12, and a time period required for the manufacturing processes is further lengthened, thereby reducing the manufacturing efficiency. If the heat treatment is carried out at a temperature of not less than 500° C., a Schottky junction in the interface between the silicon surface 11 and the surface molybdenum metal layer 3 formed in contact with the silicon surface 11 is changed to an ohmic junction. If the heat treatment is carried out within a temperature range of 300° C. to 500° C., a time period required for the manufacturing processes may not be lengthened, and it is also possible to form a good ohmic junction in the interface between the carbon surface 12 and the reverse surface molybdenum metal layer 2 formed in contact with the carbon surface 12. At the same time, a good Schottky junction can be formed in the interface between the silicon surface 11 and the surface molybdenum metal layer 3 formed in contact with the silicon surface 11.

The upper limit of a temperature at which the Schottky junction in the interface between the silicon surface 11 and the surface molybdenum metal layer 3 formed in contact with the silicon surface 11 is changed to an ohmic junction is 500° C. Accordingly, it is preferable that the heat-treating step is carried out within a temperature range of 350° C. and 450° C.

The Schottky bather diode thus manufactured has good operating characteristics with a reverse breakdown voltage of 600V to 1000V, and a forward rise voltage of 1.3 V/1A. Consequently, a Schottky barrier diode which sufficiently stands practical use can be manufactured although the manufacturing processes are shortened by using the molybdenum metal layers 2 and 3 in common for both surfaces of the SiC semiconductor substrate 1.

A Schottky barrier diode having substantially the same characteristics can be also obtained by using titanium (Ti), chromium (Cr), manganese (Mn), zirconium (Zr), tantalum (Ta), or tungsten (W), or an alloy of two or more metals selected therefrom in common as a material for the metal layers 2 and 3 for forming an ohmic junction and a Schottky junction in place of molybdenum (Mo). Although the same is true for the case of molybdenum, the above-mentioned metals react with SiC in conformity with the following reaction formula:

$$SiC+M \rightarrow M_xSi_y+M_mC_n$$

where M indicates a metal, and x, y, m, and n are natural numbers.

That is, the above-mentioned metals react with both Si and C in SiC. As a result, an ohmic junction is easy to form in an interface between the metal and SiC.

Contrary to this, metals such as iron (Fe), nickel (Ni), copper (Cu), and lead (Pb) react with only C in SiC, as expressed by the following reaction formula:

$$SiC+M \rightarrow M_xSi_y+C$$

Furthermore, aluminum (Al) or the like reacts with only Si in SiC, as expressed by the following reaction formula:

$$SiC+M \rightarrow M_mC_n+Si$$

That is, the metals such as iron, nickel, copper, lead, and aluminum react with either C or Si in SiC. As a result, an ohmic junction is difficult to form in an interface between the metal and SiC.

As to molybdenum, titanium, chromium, zirconium, tantalum, and tungsten, the free energy of formation (Gibbs free energy of formation ΔG) of the silicide of each of the metals is less than zero (a negative value), and the free energy of formation of the carbide of the metal is also less than zero. The smaller the free energy of formation is, the more easily a chemical reaction for formation occurs. When the free energy of formation takes a negative value, the chemical reaction spontaneously proceeds. On the other hand, when the free energy of formation takes a positive value, energy must be applied from the exterior in order to advance a chemical reaction for forming a product of the metal.

Therefore, it can be said that the metals, in the above-mentioned group, whose silicide formation free energy and carbide formation free energy respectively take negative values are materials that easily react with both Si and C in SiC to form a good ohmic junction.

Figure 4:
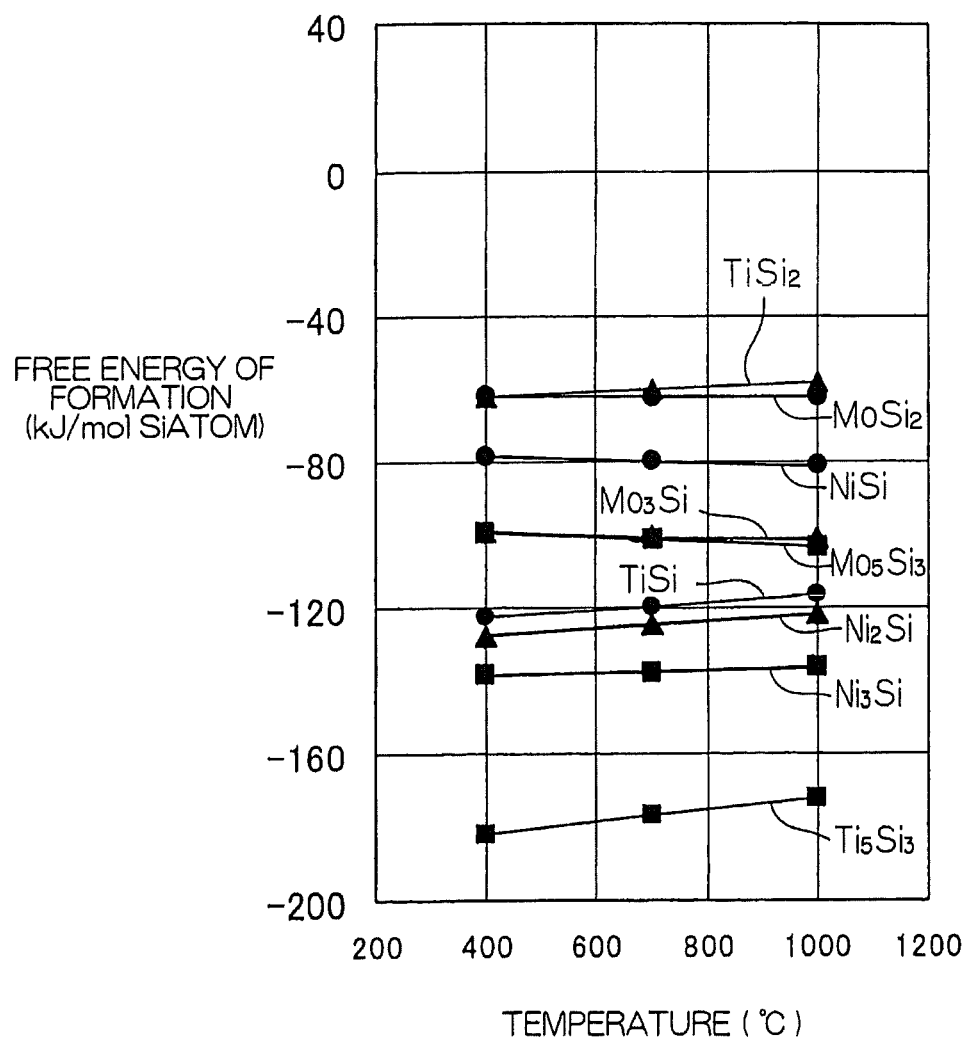
FIG. 4 is a diagram showing a silicide formation free energy.

FIG. 4 is a diagram showing the respective free energies of formation of the silicides of molybdenum, titanium, and nickel. As can be seen from FIG. 4, all the free energies of formation of the silicides of molybdenum, titanium, and nickel respectively take negative values in a temperature range of 400° C. to 1000° C.

Figure 5:
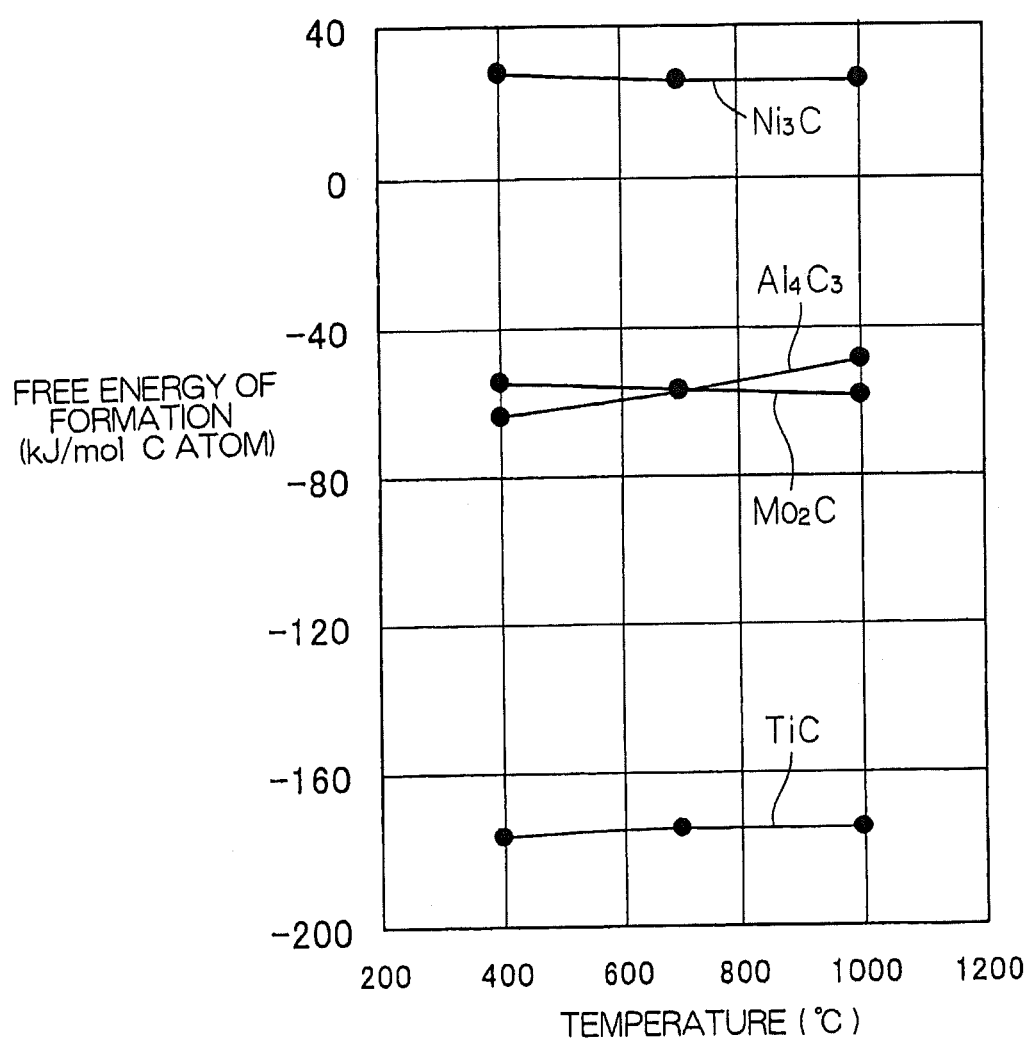
FIG. 5 is a diagram showing a carbide formation free energy.

FIG. 5 is a diagram showing the respective free energies of formation of the carbides of molybdenum, titanium, nickel, and aluminum. As can be seen from FIG. 5, the free energies of formation of the carbides of aluminum, molybdenum, and titanium respectively take negative values in a temperature range of 400° C. to 1000° C. Contrary to this, the free energy of formation of $Ni_3C$, which is the carbide of nickel, takes a positive value in a temperature range of 400° C. to 1000° C. From the foregoing, it is understood that a good ohmic junction is not easily obtained even if a nickel metal film is formed on a surface of a SiC semiconductor substrate.

Aluminum, which is not illustrated in FIG. 4, does not form a silicide by reacting with Si. Therefore, the silicide formation free energy takes a value that is too large to be illustrated in FIG. 4. If an aluminum metal layer is formed on the surface of the SiC semiconductor substrate, therefore, no good ohmic junction can be obtained.

In order to form a good ohmic junction on the surface of the SiC semiconductor substrate, it is preferable that both the carbide and silicide formation free energies are lower. Accordingly, a better ohmic junction can be formed in a case where titanium is used, as compared with that in a case where molybdenum is used.

FIGS. 4 and 5, described above, are produced on the basis of the description of a literature entitled by Shigeyuki Somiya and Kichizo Inomata "New Material Series Silicon Carbide Ceramics", Semiconductor Device R&D Division, ROHM CO., LTD., published by Uchida Rokakuho Pub., 15 Sep. 1988, p. 177-182. According to the description of the literature, the respective free energies of formation of the silicide and the carbide of zirconium are lower than those of titanium. Consequently, it is considered that a better ohmic junction can be further formed in a case where zirconium is used, as compared with that in a case where titanium is used.

The inventors of the present application have observed the respective interfaces between the silicon surface and the carbon surface and the metal layers 2 and 3 using a transmission electron microscope (TEM) with respect to the Schottky barrier diode manufactured by respectively joining the molybdenum metal layers 2 and 3 to both the surfaces of the SiC semiconductor substrate 1.

As a result, it is confirmed that a region having a thickness of approximately 30 Å that is considered to a paracrystal having a periodic crystalline structure maintained on its SiC crystal interface is formed on the carbon surface 12. That is, it is confirmed that a molybdenum metal is sufficiently diffused into the surface of the SiC semiconductor substrate 1, so that a good ohmic junction is obtained.

On the other hand, on the silicon surface 11 side, it is confirmed that an amorphous alloy region having a thickness of approximately 10 Å is formed in the interface between the molybdenum metal layer 3 and the SiC semiconductor substrate 1. Consequently, it can be said that a good Schottky junction is formed on the silicon surface 11.

Furthermore, the inventors of the present application have analyzed an amorphous alloy region in the interface between the silicon surface 11 and the molybdenum metal layer 3 using energy disperse X-ray (EDX). The results of the analysis prove that the amorphous alloy region contains an oxygen atom.

Similarly, the inventors of the present application have analyzed the interface between the carbon surface 12 and the molybdenum metal layer 2 by EDX. The results of the analysis prove that an oxygen atom exists in a SiC/Mo diffusion region where a paracrystal seems to be formed.

It is considered that the reason why an oxygen atom also exists in an ohmic junction on the carbon surface 12 of the SiC semiconductor substrate 1 is that cleaning processing or the like is performed in air. However, it is still further confirmed that the Schottky bather diode according to the above-mentioned embodiment still has good characteristics.

Figure 6:
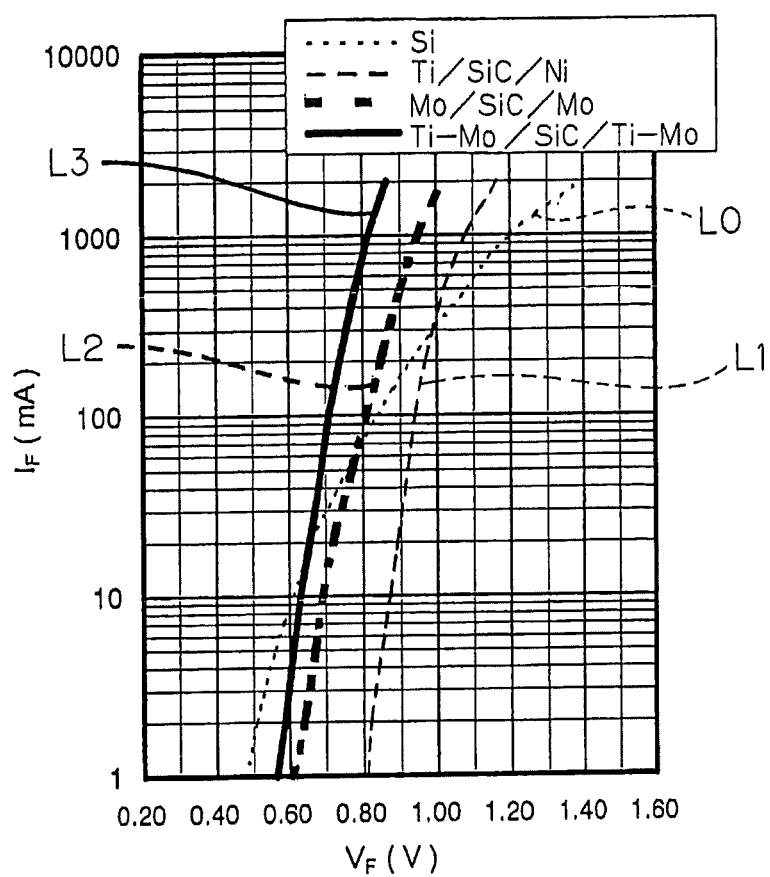
FIG. 6 is a diagram showing the forward voltage-forward current characteristics of a Schottky barrier diode.

Specifically, FIG. 6 illustrates the relationship of a forward current $I_F$ to a forward voltage $V_F$ in the above-mentioned Schottky barrier diode. As compared with a conventional SiC Schottky barrier diode indicated by a curve L1 (Ni is used for an ohmic electrode, and Ti is used for a Schottky electrode), the better rise characteristics of the forward current are obtained, as indicated by a curve L2, in the SiC Schottky bather diode according to the above-mentioned embodiment in which the molybdenum metal layers 2 and 3 are applied in common to the carbon surface 12 and the silicon surface 11. That is, the forward rise voltage $V_F$ can be reduced.

Furthermore, in a case where a metal layer composed of a titanium-molybdenum alloy (Ti—Mo) is applied to the carbon surface 12 and the silicon surface 11 of the SiC semiconductor substrate 1, the better forward rise characteristics are obtained, as compared with that in the case where the molybdenum metal layer is used, as indicated by the curve L3.

A curve L0 indicates the characteristics of the Schottky barrier diode using the Si semiconductor substrate.

Figure 7:
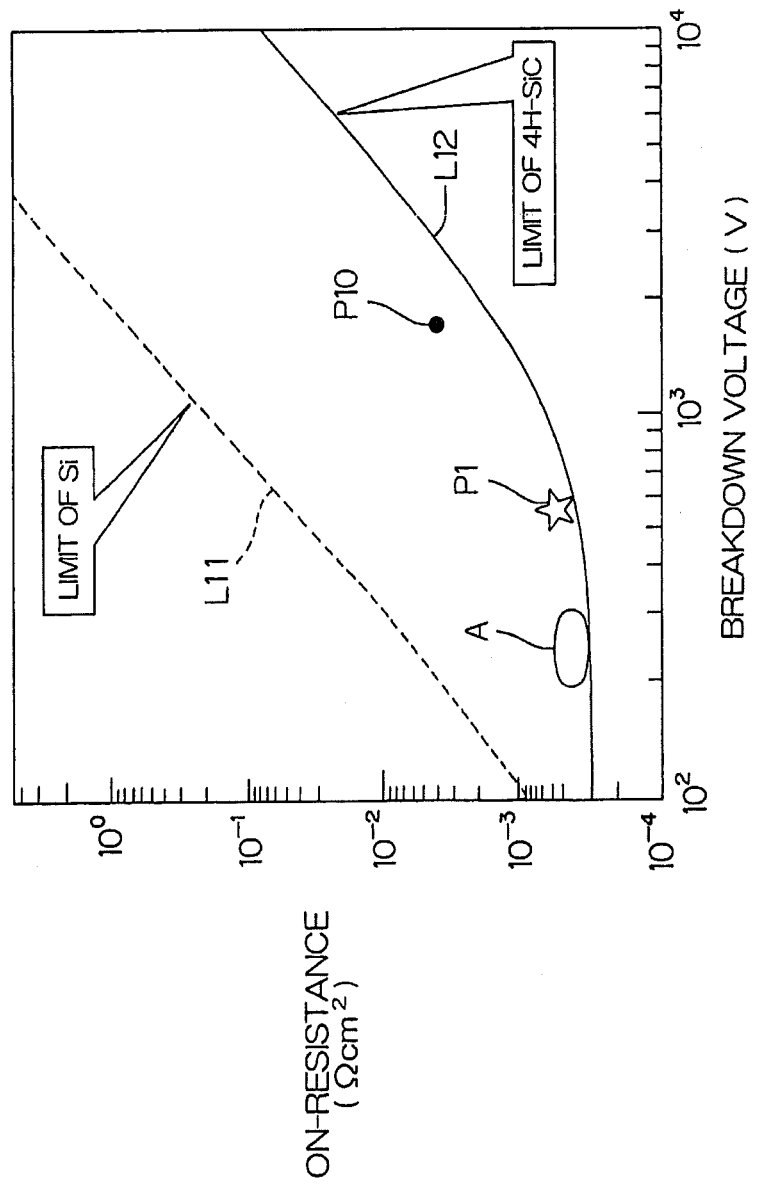
FIG. 7 is a diagram showing the on-resistance characteristics of a Schottky barrier diode.

FIG. 7 illustrates the on-resistance characteristics of the SiC Schottky barrier diode. A curve L11 indicates the limit value of an on-resistance in the silicon semiconductor device, and a curve L12 indicates the limit value of an on-resistance in the 4H—SiC semiconductor device.

The Schottky barrier diode according to the present embodiment in which the molybdenum metal layer is formed on the carbon surface and the silicon surface of the SiC semiconductor substrate exhibits a significantly low on-resistance, as indicated by point P1. If titanium metal layers are respectively applied to both surfaces of the SiC semiconductor substrate, it is expected that on-resistance characteristics in the vicinity of region A are obtained.

The on-resistance characteristics of a conventional product (using Ni for an ohmic electrode and using Ti for a Schottky electrode) are indicated by point P10.

Figure 8:
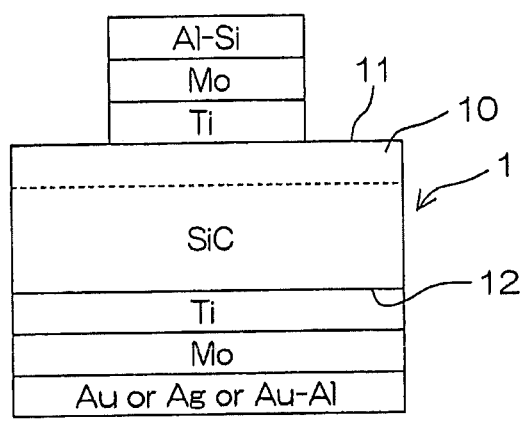
FIG. 8 is a schematic cross-sectional view showing an example of the configuration of a Schottky barrier diode in which titanium metal layers are respectively formed on both surfaces of a silicon carbide semiconductor substrate.
Figure 9A:
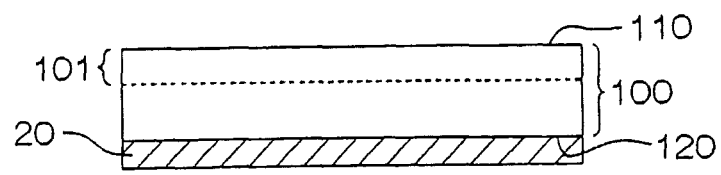
FIGS. 9(a) to 9(e) are diagram schematically showing the steps of manufacturing a conventional Schottky barrier diode.
Figure 9B:
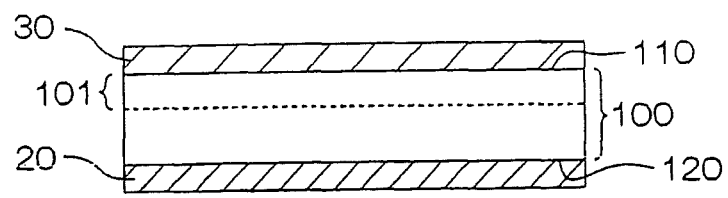
Figure 9C:
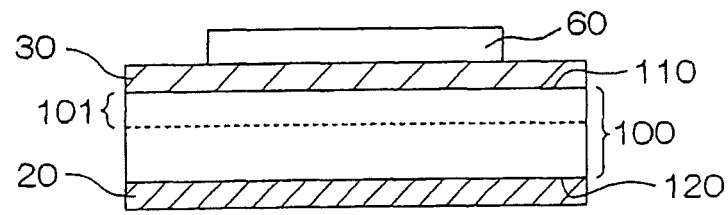
Figure 9D:
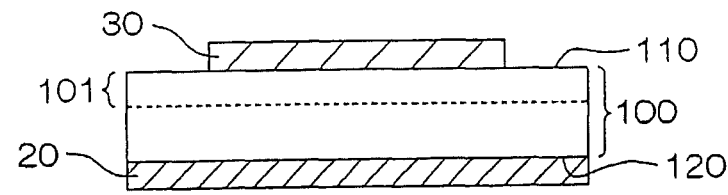
Figure 9E:
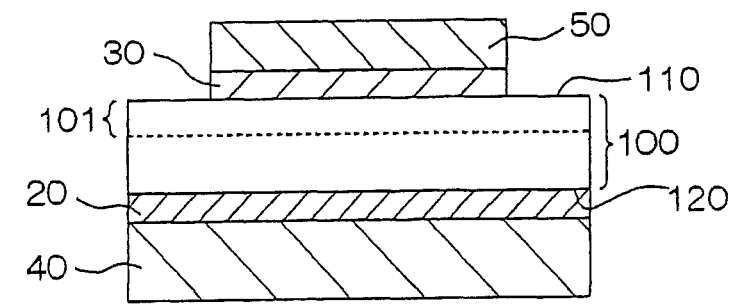
Figure 10:
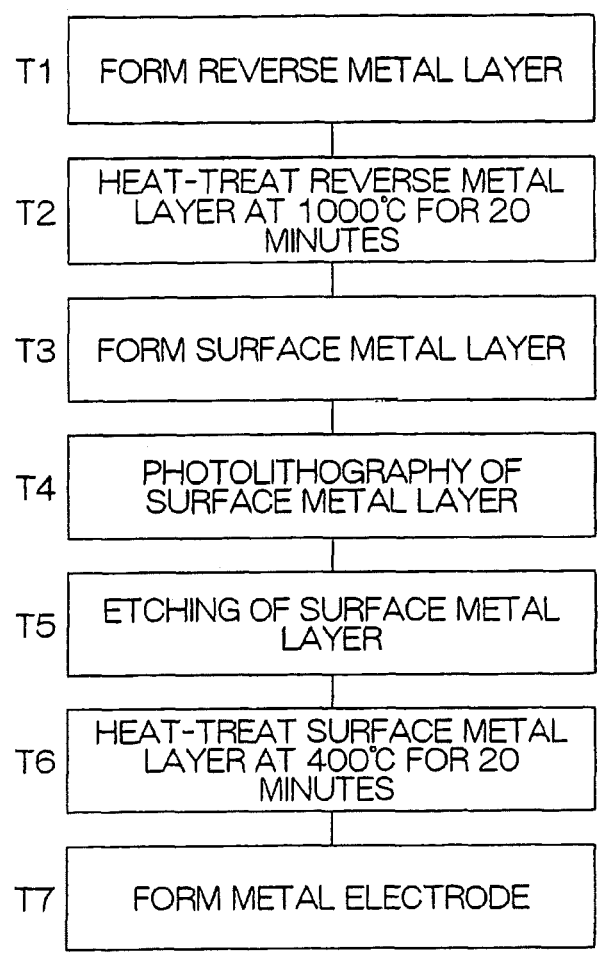
FIG. 10 is a flow chart showing the steps of manufacturing a conventional Schottky barrier diode.

FIG. 8 is a schematic cross-sectional view showing a structural example in a case where titanium metal layers are respectively formed on both surfaces of a SiC semiconductor substrate, to produce a Schottky barrier diode. In the structural example, molybdenum metal layers are respectively formed on surfaces of the titanium metal layers on both surfaces of the SiC semiconductor substrate 1, and an Al—Si alloy layer superior in adhesion to an aluminum wire is formed on the molybdenum metal layer on the side of a Schottky electrode. Further, a metal layer composed of gold (Au), silver (Ag), or a gold-silver alloy (Au—Ag) is formed on the molybdenum metal layer on the side of an ohmic electrode. Accordingly, good die-bonding to a lead frame or the like is possible.

Although description was made of one embodiment of the present invention, the present invention can be embodied in other ways. Although in the above-mentioned embodiment, description has been made of an example in which the metal layers composed of molybdenum or the like are respectively formed on both the surfaces of the SiC semiconductor substrate to configure the Schottky barrier diode, the present invention is applicable to an arbitrary SiC semiconductor device in which an electrode (a source electrode, a drain electrode, etc.) joined to a surface of the SiC semiconductor substrate in an ohmic contact must be provided, for example, a Junction field effect transistor using a SiC semiconductor substrate, a MOS field effect transistor (MOSFET), and an integrated circuit device.

Although in the above-mentioned embodiment, description has been made of an example using the N-type SiC semiconductor substrate, a P-type SiC semiconductor substrate may be used, in which case a SiC semiconductor device such as a Schottky barrier diode can be also manufactured.

Although in the above-mentioned embodiment, description has been made of an example in which an electrode joined to the silicon surface of the SiC semiconductor substrate in a Schottky contact is formed, and an electrode joined to the carbon surface in an ohmic contact is formed, a Schottky barrier diode may be manufactured by making the carrier concentration of a semiconductor layer on the side of a silicon surface higher than the carrier concentration of a semiconductor layer on the side of a carbon surface to form an ohmic electrode on the silicon surface and form a Schottky electrode on the carbon surface.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a silicon carbide semiconductor substrate having a front surface and a back surface;
   a front surface side electrode arranged on a front surface side of the silicon carbide semiconductor substrate;
   a back surface side electrode arranged on a back surface side of the silicon carbide semiconductor substrate;
   a first intermediate metal layer interposed between the silicon carbide semiconductor substrate and the front surface side electrode, the first intermediate metal layer being in contact with the front surface of the silicon carbide semiconductor substrate at least within a contact area defined on the front surface of the silicon carbide semiconductor substrate; and
   a peripheral area including an edge termination provided in the silicon carbide substrate in contact with a peripheral edge of the first intermediate metal layer on a surface thereof contacting the front surface, the peripheral area defining the contact area.

2. The semiconductor device according to claim 1, further comprising a second intermediate metal layer interposed between the silicon carbide semiconductor substrate and the back surface side electrode.

3. The semiconductor device according to claim 2, wherein the second intermediate metal layer is in an ohmic contact with the back surface of the silicon carbide semiconductor substrate.

4. The semiconductor device according to claim 2, wherein the second intermediate metal layer is composed of molybdenum or an alloy of molybdenum and at least one metal material selected from a group consisting of titanium, chromium, manganese, zirconium, tantalum, and tungsten.

5. The semiconductor device according to claim 2, wherein the first intermediate metal layer and the second intermediate metal layer are composed of a same metal material.

6. The semiconductor device according to claim 5, wherein the metal material includes molybdenum.

7. The semiconductor device according to claim 1, wherein the first intermediate metal layer is in a Schottky contact with the front surface of the silicon carbide semiconductor substrate within the contact area.

8. The semiconductor device according to claim 1, wherein the silicon carbide semiconductor substrate has a first semiconductor layer on the front surface side thereof and a second semiconductor layer on the back surface side thereof, and a carrier concentration of the first semiconductor layer is higher than a carrier concentration of the second semiconductor layer.

9. The semiconductor device according to claim 8, the carrier concentration of the first semiconductor layer is within a range of $10^{17}$ to $10^{21}$/cm$^3$, and the carrier concentration of the second semiconductor layer is within a range of $10^{14}$ to $10^{16}$/cm$^3$.

10. The semiconductor device according to claim 1, wherein the front surface side electrode contains aluminum, and the back surface side electrode contains at least one of gold, silver and a gold-silver alloy.

11. The semiconductor device according to claim 1, wherein the front surface is a silicon surface of the silicon carbide semiconductor substrate, and the back surface is a carbon surface of the silicon carbide semiconductor substrate.

12. The semiconductor device according to claim 1, wherein the edge termination surrounds the contact area to define the contact area.

13. The semiconductor device according to claim 1, wherein the edge termination is a boron-implanted region in the silicon carbide substrate.

14. A semiconductor device, comprising:
   a silicon carbide semiconductor substrate having a front surface and a back surface;
   a front surface side electrode arranged on a front surface side of the silicon carbide semiconductor substrate;
   a back surface side electrode arranged on a back surface side of the silicon carbide semiconductor substrate;
   a first intermediate metal layer interposed between the silicon carbide semiconductor substrate and the front surface side electrode, the first intermediate metal layer being in contact with the front surface of the silicon carbide semiconductor substrate at least within a contact area defined on the front surface of the silicon carbide semiconductor substrate; and
   a peripheral area provided in the silicon carbide substrate in contact with a peripheral edge of the first intermediate metal layer on a surface thereof contacting the front surface, the peripheral area defining the contact area,
   wherein the first intermediate metal layer is composed of an alloy including molybdenum and manganese.

* * * * *